United States Patent [19]

Baskin

[11] Patent Number: 5,781,069

[45] Date of Patent: Jul. 14, 1998

[54] PRE-POST DISTORTION AMPLIFIER

[75] Inventor: Brian L. Baskin, Cupertino, Calif.

[73] Assignee: Xemod, Inc., Sunnyvale, Calif.

[21] Appl. No.: 649,841

[22] Filed: May 16, 1996

[51] Int. Cl.[6] .................................................. H03F 1/26
[52] U.S. Cl. ............................................ 330/149; 330/151
[58] Field of Search ................................ 330/129, 136, 330/149, 151

[56] References Cited

U.S. PATENT DOCUMENTS 5,528,196    6/1996   Baskin et al. ........................... 330/151

*Primary Examiner*—Steven Mottola
*Attorney, Agent, or Firm*—Boris G. Tankhilevich

[57] ABSTRACT

A pre-post distortion amplifier is disclosed. The device comprises the four-cascade amplifier comprising two driver amplifiers and two power amplifiers. The pre-post distortion amplifier allows one to amplify at least two RF signals with almost full compensation of the distortion signal introduced by the propagation of input signals within the pre-post distortion amplifier. Each pair of driver-power amplifiers is scaled down in power output to achieve the optimum result.

10 Claims, 4 Drawing Sheets

PRE-POST DISTORTION AMPLIFIER

BACKGROUND

Increasing demand for mobile and personal communication services has renewed interest in spectrally efficient modulation schemes. Since the most efficient forms of RF power amplifications are non-linear, CPM (Continuous Phase Modulation) schemes have been preferred for portable wireless applications (e.g. Gaussing Minimum Shift Keying-GMSK). Because of growing pressures for extra capacity however, the advantages of retaining a constant envelope are giving way to linear modulation (e.g. π/4 Shift DQPSK).

Although the filtering applied in linear modulation schemes produces gains in spectrum utilization, envelope variations are also introduced. Such signals when passed through non-linear RF amplifiers undergo distortions (Amplitude-to-Amplitude Modulation (AM/AM) and Amplitude-to-Phase Modulation (AM/PM)) which result in a spreading of the spectrum beyond the allocated channel and reduced performance. The inefficiency and cost of conventional linear RF amplifiers (e.g. Class A) would have a disastrous effect on the battery life of portable wireless transmitting equipment and significantly increase the cost of the base station infrastructure equipment and its operation. Improvements in RF amplifier efficiency would, directly lead to improvements in the talk-time, recharging intervals, and size and weight of the overall wireless unit. The ideal amplifier for a linear modulated portable apparatus is therefore a linear amplifier which is also power efficient.

Because linear amplifiers can amplify signals with any combination of amplitude and phase modulation, the choice of modulation scheme is not limited by the transmitter and hence can be software selectable. This is advantageous in military applications, and in commercial applications crossing international borders and standards. Other applications for linear amplification include various digital cellular and Private Mobile Radio (PMR) systems, traditional Amplitude Modulation (AM) and Single Side-Band (SSB) systems, and instances, where transmitter turn-on is to be well controlled such as bandlimited pulse systems found in radar and paging applications and in Time Division Multiple Access (TDMA) systems. Linear amplifiers can also accommodate the envelope variations caused by the combination of multiple signals such as those found in multicarrier base stations.

However, even linear amplifiers distort the signal at some power level. Indeed, when two input RF signals Li and L2 propagate through the linear amplifier, the amplifier introduces in first approximation an intermodulation product like an intermod signal $\alpha F(L1, L2)$, wherein a is a parameter of expansion in series, and $F(L1, L2)$ is a linear function of (L1, L2). Intermodulation products are undesirable because they cause interference, crosstalk and spectral regrowth.

Another source of non-linearity is caused by a cascade of RF power amplifiers. Indeed, RF power amplifiers are used in a wide variety of communications and other electronic applications. These amplifiers are made up of one or more cascaded amplifier stages, each of which increases the level of the signal applied to the input of that stage by an amount known as the stage gain. Ideally, the input-to-output transfer of each stage is linear; a perfect replica of the input signal increased in amplitude appears at the amplifier output. In reality, all power amplifiers have a degree of non-linearity in their transfer characteristics. This non-linearity results in the distortion of the output signal so that it is no longer a perfect replica of the input. This kind of distortion also produces undesirable intermodulation products. Accordingly, the prior art reflects various methods and devices designed to reduce the distortion produced during a power amplifier's operation.

The most common method is called feedback. It has long been known that feedback can linearize non-linear systems. Cartesian feedback which uses negative feedback of the baseband quadrature modulation, provides excellent reduction in intermodulation distortion with low complexity and cost. A typical example of what is achievable with Cartesian feedback is given by M. Johannson and T. Matsson in "Transmitter Linearization using Cartesian Feedback for Linear TDMA Modulation", in the proceedings of the 41st IEEE Vehicular Technology Conferences, St. Louis, USA, VCT-91, pp 439–444, May, 1991.

High level modulation of the power supply of an RF power amplifier, for the purposes of amplitude (or envelope) modulation, is a well established technique which provides good power efficiency when combined with efficient high level power supply modulators. This is the basis for amplitude feedback only techniques of EP Pat. No. 431201. The problem with this system is the relatively larger bandwidth of the amplitude signals compared with corresponding baseband quadrature modulation and with the inability to control AM-PM distortions. Consequently, the spectral control is generally inferior to that of Cartesian feedback, IF feedback, and RF feedback. Full polar feedback (both amplitude and phase feedback) overcomes the limitation of the inability to control AM-PM distortions, but still suffers from the bandwidth expansion problem on both the amplitude and phase signals.

Thus, feedback works well at low frequencies but it becomes a problem at ultra high frequencies. At these frequencies two basic methods are generally used. They are feedforward and pre-distortion.

The feedforward method generates an error signal by separating the distortion products from the desired signal to obtain a pure distortion error signal. After suitable scaling and delay matching, this error signal, which is out of phase with the distortion, is applied to the output, resulting in a reduction in the distortion. However, the error signal must be amplified by a linear RF power amplifier. This results in a compromise since in general, as the efficiency of an RF power amplifier increases, so does its distortion and hence the error signal level to be amplified by the linear amplifier. The larger the error signal level the larger the linear amplifier and hence the greater the power consumption and the lower the efficiency. Such systems have been applied particularly for wideband linearization schemes. A typical example is disclosed by P. B. Kenington, M. A. Beach, A. Bateman, and J. P. McGeehan in PCT Pat. No. Wo 91/16760.

One way to achieve the maximum distortion reduction in the feedforward architecture is to inject a distortion simulating pilot at the input of an amplifier. The magnitude of the pilot signal in the amplifier output is used to control a decreasing step size circuit algorithm for adjusting the gain and phase of the feed forward distortion signal to eliminate substantially the pilot signal and the distortion introduced by the amplifier. This approach is disclosed in U.S. Pat. No. 4,580,105 issued to Myer.

Another way to minimize a feedforward distortion is to include a feedforward minimization circuit that continuously, accurately and efficiently performs the gain and phase adjustments necessary to improve and maintain the intermodulation performance of a power amplifier, while avoiding unwanted interactions between cancellation adjustments and while minimizing power wasted in a dump load. This is disclosed in U.S. Pat. No. 5,444,418 issued to Mitzlaff.

The pre-distortion method of minimizing the distortion involves producing a distortion similar to the distortion being generated by the linear amplifier and adding it at the input in the correct gain, phase and delay to produce cancellation of the distortion at the output of the linear amplifier. This method requires matching the distortion characteristics of two amplifiers. However, the distortion characteristics of two amplifiers can vary over frequency and temperature, thus limiting the amount of correction that can be obtained.

What is needed is a method of linearization of a cascade of non-linear RF power amplifiers by matching the distortion characteristics of each pair of amplifiers in the cascade of amplifiers that takes into account the variation of the distortion characteristics of each amplifier over frequency, over temperature, and over other sources of non-linearity.

SUMMARY

The present invention is unique because it discloses an apparatus and a method for linearization of a cascade of non-linear RF amplifiers by matching the distortion characteristics of each pair of amplifiers, and by taking into account the variation of the distortion characteristics of each amplifier over frequency, over temperature, and over other sources of non-linearity.

One aspect of the present invention is directed to a pre-post distortion apparatus for eliminating non-linear distortions generated by propagation of at least two radio-frequency (RF) signals Li and L2 or a complex spread spectrum signal through the pre-post distortion apparatus. The pre-post distortion apparatus comprises (A) an inner loop means and (B) an outer loop means.

The inner loop means further comprises: (1) a first non-linear low level driver amplifier means F/N2 for generating a first composite signal CS1 comprising at least two input signals (L1, L2) and the first intermod signal $\alpha(F/N2)(L1, L2)$; (2) a first non-linear high level output amplifier means F for generating a second composite signal CS2 comprising at least two input signals (L1, L2), the first intermod signal $\alpha(F/N2)(L1,L2)$, and the second intermod signal $\alpha F(L1, L2)$; (3) a second non-linear low level driver amplifier means G/N1 for generating a third composite signal CS3 comprising the two input signals (L1, L2), the first intermod signal $\alpha(F/N2)(L1,L2)$, the second intermod signal $\alpha F(L1, L2)$, and the third intermod signal $\alpha(G/N1)(L1, L2)$; (4) a phase-amplitude comparator (PAC) for amplitude-comparing the eighth composite signal CS8 and the third composite signal CS3, wherein the PAC means generates a first amplitude error signal Amplitude-Error1; (5) a first delay means for delaying the first composite signal CS1 and for inverting the phase of the first composite signal CS1, wherein the first delay means generates a fourth composite signal CS4; (6) a first amplitude adjuster means A1 utilizing the first amplitude error signal Amplitude-Error for amplitude-adjusting the first composite signal CS1 and for closing the inner loop; (7) an automatic gain control circuit (AGC) means for automatically controlling the power levels of the first low level amplifier F/N2 and the first high level amplifier F, for ensuring that the power output of the high level amplifier means F is proportional to the power output of the first low level amplifier means F/N2, and for generating a second Amplitude-Error2 signal; and (8) a second amplitude adjuster means A2 utilizing the second Amplitude-Error2 signal for adjusting the power level of the composite signal CS1 generated by the low level amplifier F/N2.

The outer loop means comprises: (1) a first adder means for summing the fourth composite signal CS4 and the third composite signal CS3 up to the second approximation, wherein the first adder means outputs a fifth composite signal CS5 comprising the second intermod signal $\alpha F(L1, L2)$, the third intermod signal $\alpha(G/N1)(L1,L2)$, and a second approximation component $\alpha^2 Adder(L1, L2)$; (2) an error amplifier means for amplifying and inverting the fifth composite signal CS5, wherein the error amplifier outputs a sixth composite signal CS6 comprising in the second approximation an increased and inverted second intermod signal $(-)\beta\alpha F(L1, L2)$, an increased and inverted third intermod signal $(-)\beta\alpha(G/N1)(L1,L2)$, and an increased and inverted second approximation component $(-)\beta\alpha^2 Adder(L1, L2)$, wherein $\beta$ is an increase factor that optimizes the compensation; (3) a second delay means for delaying the third composite signal CS3 in order to equalize the electrical paths of the third composite signal CS3 and the sixth composite signal CS6; (4) a second adder means for summing the delayed third composite signal CS3 and the sixth composite signal CS6, wherein the second adder means outputs a seventh composite signal CS7 comprising in the first approximation the two input signals (L1, L2), and an inverted third intermod signal $(-)\alpha(G/N1)(L1, L2)$; and (5) a second non-linear high level power amplifier means G generating an eighth composite signal CS8 comprising two input signals (L1, L2), the inverted third intermod signal $(-)\alpha(G/N1)(L1,L2)$, and the fourth intermod signal $\alpha G(L1, L2)$, and wherein the inverted third intermod signal $(-)\alpha(G/N1)(L1,L2)$, and the fourth intermod signal $\alpha G(L1, L2)$ cancel out each other in the first approximation.

In the preferred embodiment, the inner loop further includes a phase adjuster means $\Theta$ utilizing a phase error signal Phase-Error generated by the phase-amplitude comparator (PAC) means for phase-adjusting the first composite signal CS1 and for closing the inner loop.

In the preferred embodiment, the outer loop means further includes a circuit for stabilizing the gain and phase of the error amplifier means over the drive level, frequency and temperature, and for improving the linearity of the error amplifier means.

In one embodiment, the circuit for stabilizing the gain and phase of the error amplifier over frequency and temperature further includes a feedforward loop. In another embodiment, the circuit for stabilizing the gain and phase of the error amplifier over frequency and temperature further includes a feedback loop.

One more aspect of the present invention is directed to an alternative architecture of the pre-post distortion apparatus for eliminating non-linear distortions generated by propagation of at least two radio-frequency (RF) signals LI and L2 through the pre-post distortion apparatus. The alternative pre-post distortion apparatus comprises: (A) an inner loop means and an outer loop means.

The inner loop means further comprises: (1) a first non-linear low level driver amplifier means F/N2 for generating a first composite signal CS1 comprising the two input signals (L1, L2) and the first intermod signal $\alpha(F/N2)(L1, L2)$; (2) a first non-linear high level power amplifier means F for generating a second composite signal CS2 comprising the two input signals (L1, L2), the first intermod signal $\alpha(F/N2)(L1,L2)$, and the second intermod signal $\alpha F(L1, L2)$; (3) a second non-linear low level driver amplifier means G/N1 for generating a third composite signal CS3 comprising the two input signals (L1, L2), the first intermod signal α(F/N2)(L1,L2), the second intermod signal αF(L1, L2), and the third intermod signal α(G/N1)(L1, L2); (4) a third non-linear low level driver amplifier means F*/N2 for generating a fourth composite signal CS4 comprising the two input signals (L1, L2) and the fourth intermod signal α(F*/N2)(L1,L2); (5) a phase-amplitude comparator (PAC) means for generating a phase error signal Phase-Error, and for generating a first amplitude error signal Amplitude-Error1; (6) a phase adjuster means Θ utilizing the phase error signal Phase-Error for phase- adjusting the incoming two input signals (L1, L2), wherein the phase adjusting operation is performed at the initial power level of the incoming signal; (7) a first delay means for delaying the fourth composite signal CS4; (8) a first amplitude adjuster means A1 utilizing the first amplitude error signal Amplitude-Error1 for amplitude-adjusting the fourth composite signal CS4 and for closing the inner loop; (9) an automatic gain control circuit (AGC) means for automatically controlling the power levels of the first low level amplifier F/N2 and the first high level amplifier F, for ensuring that the power output of the high level amplifier means F is proportional to the power output of the first low level amplifier means F/N2, and for generating a second Amplitude-Error2 signal; and (10) a second amplitude adjuster means A2 utilizing the second Amplitude-Error2 signal for adjusting the power level of the composite signal CS1 generated by the low level amplifier F/N2.

The outer loop means comprises: (1) a first adder means for summing the delayed fourth composite signal CS4 and the third composite signal CS3 up to the second approximation, wherein the first adder means outputs a fifth composite signal CS5 comprising the second intermod signal αF(L1, L2), the third intermod signal α(G/N1)(L1,L2), and a second approximation component $\alpha^2$Adder(L1, L2); (2) an error amplifier means for amplifying and inverting the fifth composite signal CS5, wherein the error amplifier outputs a sixth composite signal CS6 in the second approximation comprising an increased and inverted second intermod signal (−)βαF(L1, L2), an increased and inverted third intermod signal (−)βα(G/N1)(L1,L2), and an increased and inverted second approximation component (−)β$\alpha^2$Adder (L1, L2); (3) a second delay means for delaying the third composite signal CS3 in order to equalize the electrical paths of the third composite signal CS3 and the sixth composite signal CS6 generated by the error amplifier means; (4) a second adder means for summing the delayed third composite signal CS3 and the sixth composite signal CS6, wherein the second adder means outputs a seventh composite signal CS7 comprising in the first approximation the two input signals (L1, L2), and an inverted third intermod signal (−)α(G/N1)(L1, L2); and (5) a second non-linear high level power amplifier means G for generating an eighth composite signal CS8 comprising in the first approximation the two input signals (L1, L2), the inverted third intermod signal (−)α(G/N1)(L1,L2), and the fifth intermod signal αG(L1, L2), and wherein the inverted third intermod signal (−)α(G/N1)(L1,L2), and the fifth intermod signal αG(L1, L2) cancel each other out in the first approximation.

In the preferred embodiment, the outer loop of the alternative pre-post distortion amplifier further includes a circuit for stabilizing the gain and phase of the error amplifier over frequency and temperature, and for improving linearity of the error amplifier.

Yet one more aspect of the present invention is directed to a pre-post distortion method for eliminating non-linear distortions generated by propagation of at least two radio-frequency (RF) signals L1 and L2 through the pre-post distortion apparatus. The pre-post distortion method comprises the steps of: (1) amplifying at least two input RF signals (L1, L2) by a first non-linear low level driver amplifier means F/N2; (2) introducing in first approximation by a first intermod signal α(F/N2)(L1, L2) of the two input signals (L1, L2), (3) generating a first composite signal CS1 comprising the two input signals (L1, L2) and the first intermod signal α(F/N2)(L1,L2); (4) amplifying the first composite signal CS1; (5) introducing in the first approximation a second non-linear intermod signal αF(L1, L2) of the two input signals (L1, L2); (6) generating a second composite signal CS2 comprising the two input signals (L1, L2), the first intermod signal α(F/N2)(L1,L2), and the second intermod signal αF(L1, L2); (7) amplifying the second composite signal CS2; (8) introducing in first approximation a third intermod signal α(G/N1) (L1, L2); (9) generating a third composite signal CS3 comprising the two input signals (L1, L2), the first intermod signal α(F/N2)(L1, L2), the second intermod signal αF(L1, L2), and the third intermod signal α(G/N1)(L1, L2); (10) amplitude-comparing the first composite signal CS1 and the second composite signal CS2; (11) delaying and inverting the phase of the first composite signal CS1 (12) amplitude-adjusting the first composite signal CS1 and closing the inner loop; (13) automatically controlling the power levels of the first low level amplifier F/N2 and the first high level amplifier F, ensuring that the power output of the high level amplifier means F is proportional to the power output of the first low level amplifier means F/N2, and generating a second Amplitude-Error2 signal; (14) adjusting the power level of the composite signal CS1; (15) summing the fourth composite signal CS4 and the third composite signal CS3 up to the second approximation; (16) generating a fifth composite signal CS5 comprising the second intermod signal αF(L1, L2), the third intermod signal α(G/N1)(L1,L2), and a second approximation component $\alpha^2$Adder(L1, L2); (17) amplifying and inverting the fifth composite signal CS5, and generating a sixth composite signal CS6; (18) delaying the third composite signal CS3 in order to equalize the electrical paths of the third composite signal CS3 and the sixth composite signal CS6; (19) summing the delayed third composite signal CS3 and the sixth composite signal CS6, and generating a seventh composite signal CS7 comprising in the first approximation the two input signals (L1, L2), and an inverted third intermod signal (−)α(G/N1)(L1, L2); (20) amplifying the seventh composite signal CS7; (21) introducing in the first approximation a fourth non-linear intermod signal αG(L1, L2) of the two input signals (L1, L2); (22) generating an eighth composite signal CS8 comprising in the first approximation the two input signals (L1, L2), the fourth non-linear intermod signal αG(L1, L2), and the inverted third intermod signal (−)α(G/N1)(L1, L2), wherein the fourth non-linear intermod signal αG(L1, L2) and the inverted third intermod signal cancel each other out; and (23) feeding back the eighth composite signal CS8 to the PAC means in order to compensate for gain variation of the second high level power amplifier means G and to properly scale the output power of the second low level driver amplifier G/N1 and the second high level power amplifier G.

FULL DESCRIPTION OF THE PREFERRED EMBODIMENT

Figure 1:
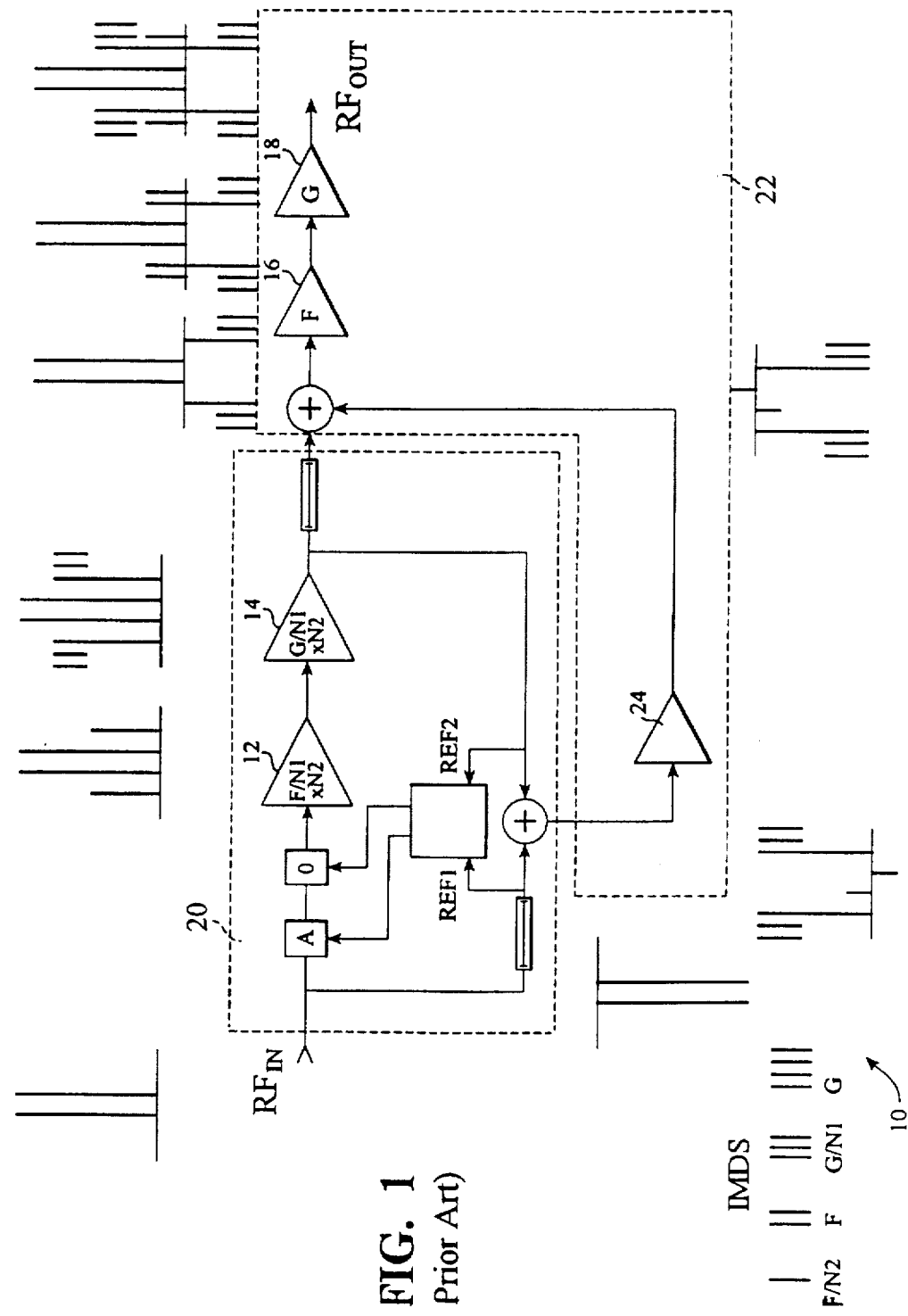
FIG. 1 depicts a conventional pre-distortion amplifier.

The conventional pre-distortion circuit (10) is shown in FIG. 1. The conventional pre-distortion circuit introduces distortion signals when at least two input RF signals with frequencies L1 and L2 propagate through it. The distortion signals can not be effectively filtered out because they are in the band of relevant input signals L1 and L2. Therefore, the conventional pre-distortion method of minimizing the distortion involves producing a distortion similar to the distortion being generated by each linear amplifier and adding it at the input in the correct gain, phase and delay to produce cancellation of the distortion at the output of each linear amplifier. This method requires matching the distortion characteristics of each two amplifiers in the cascade of amplifiers. However, the circuit shown in FIG. 1 has inherent limitations that make it practically undesirable.

The first drawback of this design is ratio of the power output of the driver stages to that of the output stages. In order to work properly, the driver stages F/N1×N2 (12) and G/N1×N2 (14) should be exact replicas of the output stages F (16) and G (18), respectively. Theoretically, the inner loop (20) predistorts the outer loop (22). To be able to compensate for the distortion signals, all non-linear characteristics of the driver stage and the output stage should remain identical regardless of frequency, temperature and power.

EXAMPLE 1

Because of the topology, the amplifier G (18) may put out 25 Watt (W), while its scaled replica, G/N1×N2 (14), may put out only 630 milliwatt (mW). Thus, the ratio of these two powers is about a factor of 40. Comparing amplifier F(16) (3.16 W) and its counter part, F/N1×N2 (12) (0.079 W), yields the same result.

Any two amplifiers whose output powers differ by a factor of 40 will not behave identically. Therefore, the topology of the conventional pre-distortion circuit makes this circuit less than perfect for purposes of eliminating the distortion signals. Indeed, even if the driver part were installed in the same package as the output device, it is clear that important parameters such as bond wire coupling, common lead inductance, and thermal resistance will not be consistent between the two parts, the inner loop (20), and the outer loop (22). Therefore, the most crucial parameters of the conventional pre-distortion scheme, intermodulation and temperature performance, will not be consistent.

Secondly, the fundamental premises of the pre-distortion are: (1) the driver-amplifier is a scaled replica of its counterpart, and (2) the driver's amplifier's operating point replicates that of the output device and vice versa. The conventional pre-distortion circuit (10) does not provide any means to make the output power of the driver stages proportional to their scaled counterparts. Indeed, the output power of driver amplifier G/N1×N2 (14) might change relative to its counterpart amplifier G (18). Accordingly, the dynamic operating point of the G/N1×N2 amplifier (14) and therefore its intermodulation characteristics will differ from the dynamic operating point and intermodulation characteristics of the G amplifier (18).

Thirdly, there are intrinsic shortcomings associated with the error amplifier (24). Any compensation scheme requires that the error amplifier be highly accurate. Gain and phase variations within the error amplifier (24) will significantly affect the overall system performance. The conventional pre-distortion circuit (10) does not include any means to mitigate the gain.and phase variations within the error amplifier.

Lastly, the distortion characteristics of the conventional pre-distortion circuit-including the pair of G (18) and G/N1× N2 (14) amplifiers, and the pair of F (16) and F/N1×N2 (12) amplifiers do not provide for the identical operation conditions.

Figure 2:
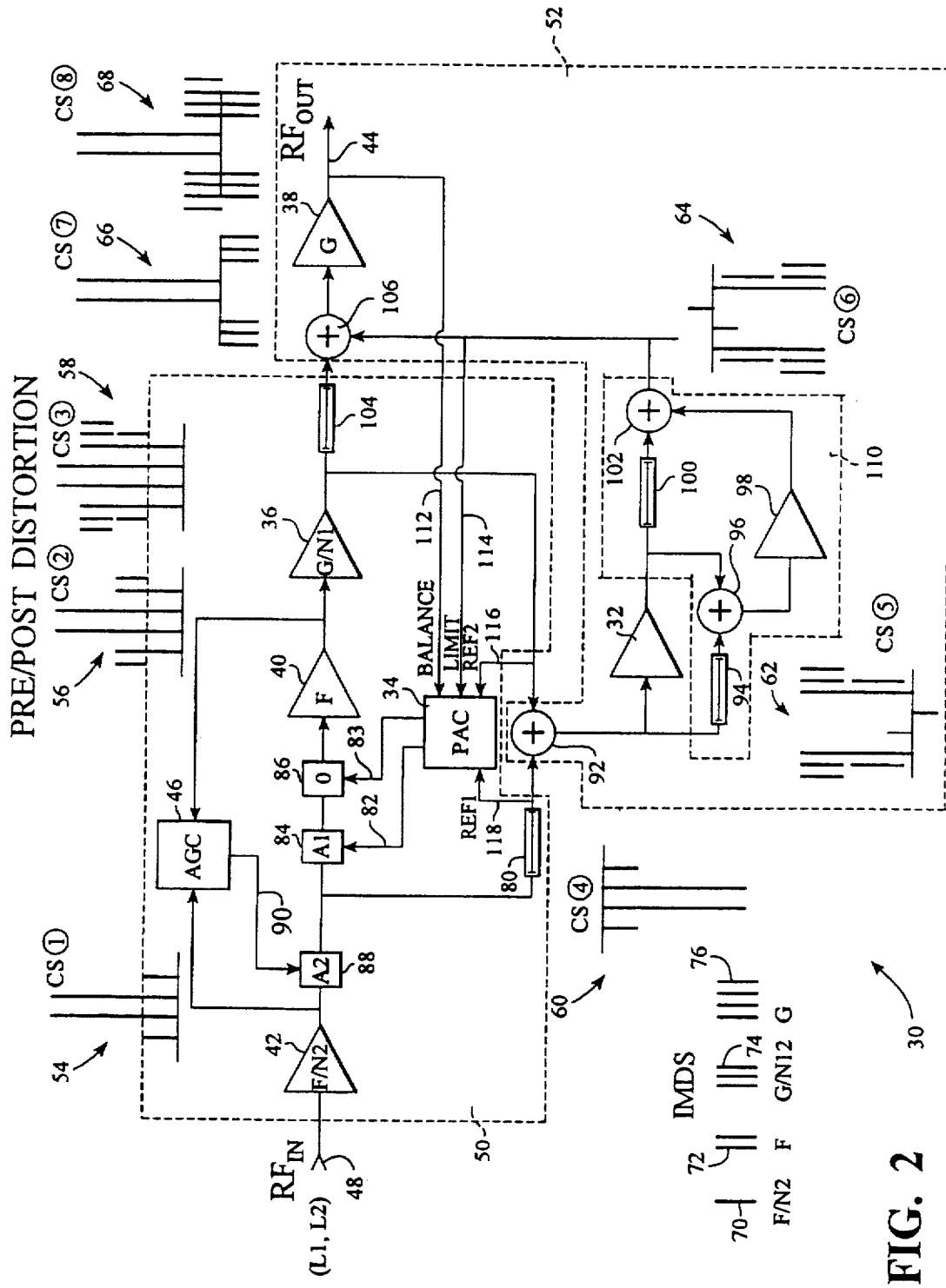
FIG. 2 is an illustration of a pre-post distortion amplifier.

FIG. 2 illustrates the preferred embodiment of the pre-post distortion circuit (30) which comprises the subject matter of the present invention. The pre-post circuit (30) overcomes the shortcomings of the prior art discussed above. Indeed, as it is shown below, the pre-post distortion amplifier (30) comprises a four stage closed-loop amplifier (the driver amplifier F/N2 (42), the power amplifier F (40), the driver amplifier G/N1 (36), and the power amplifier G (38)) with a very high degree of linearity. The output power of each block is chosen such that the behavior of the driver devices truly replicate a scaled version of the pre-driver devices. The error amplifier (32) is enclosed by a circuit which stabilizes the gain and phase of the error amplifier over frequency and temperature. The output power $RF_{out}$ of the system (44) is fed back and compared to the output power of the previous stage at the phase-amplitude comparator (PAC) (34). The PAC (34) makes the final two stages G (38) and G/N1 (36) to have properly scaled output power levels. Finally, an Automatic Gain Control (AGC) (46) ensures that the power output of the second stage F (40) is proportional to that of the first stage F/N2 (42), thus guaranteeing that the first two stages have properly scaled output power.

Referring again to FIG. 2, at least two radio frequency (RF) input signals L1 and L2 (42) are introduced into the pre-post distortion apparatus (30). The apparatus (30) is designed for eliminating non-linear distortions generated by propagation of at least two radio-frequency (RF) signals L1 and L2 through it. The pre-post distortion apparatus (30) comprises an inner loop (50) and an outer loop (52).

The inner loop (50) comprises a first non-linear low level driver amplifier F/N2 (42). The amplifier F/N2 introduces in first approximation a first intermod signal α(F/N2)(L1, L2) (70) of two input signals (L1, L2) and outputs a first composite signal CS1 (54) comprising the two input signals (L1, L2) and the first intermod signal α(F/N2)(L1,L2), wherein α is a parameter of expansion in series. It is assumed that amplitudes of all intermod signals are small in comparison with the amplitudes of the input signals L1 and L2.

The inner loop further includes a first non-linear high level power amplifier F (40) which introduces in the first approximation a second non-linear intermod signal αF(L1, L2) (72) of said two input signals (L1, L2), and outputs a second composite signal CS2 (56) comprising the two input signals (L1, L2), the first intermod signal α(F/N2)(L1,L2), and the second intermod signal αF(L1, L2). The inner loop also includes a second non-linear low level driver amplifier G/N1 (36) which introduces in the first approximation a third intermod signal α(G/N1) (L1, L2) 74), and outputs a third composite signal CS3 (58) comprising two input signals (L1, L2), the first intermod signal α(F/N2)(L1,L2), the second intermod signal αF(L1, L2), and the third intermod signal α(G/N1)L1, L2).

The inner loop (50) further includes a first delay (8) which delays, inverts the phase of the first composite signal CS1 (54) and generates a fourth composite signal CS4 (60). A phase-amplitude comparator (PAC) (54) compares the amplitudes of the eighth composite signal CS8 and the fourth composite signal CS4. The comparator PAC generates a first amplitude error signal Amplitude-Error1 (82). A first amplitude adjuster A1 (84) utilizes the first amplitude error signal Amplitude-Error1 (82) in order to adjust the amplitude of first composite signal CS1 and to close the inner loop.

An automatic gain control circuit (AGC) (46) automatically controls the power levels of the first low level amplifier F/N2 (42) and the first high level amplifier F (40), ensures that the power output of the high level amplifier F is proportional to the power output of the first low level amplifier F/N2, and generates a second Amplitude-Error2 signal (90).

Finally, the inner loop (50) includes a second amplitude adjuster A2 (88) which utilizes the second Amplitude-Error2 signal (90) for adjusting the power level of the composite signal CS1 (54).

In the preferred embodiment, the inner loop (50) farther includes a phase adjuster Θ (86) that utilizes a phase error signal Phase-Error (83) generated by the comparator (34) for phase-adjusting the first composite signal CS1 (54) and for closing the inner loop.

An outer loop (52) comprises a first adder (92) which sums the fourth composite signal CS4 (60) and the third composite signal CS3 (58) up to the second approximation because in the first approximation the incoming (L1, L2) signals are cancelled out. Therefore, the first adder (92) outputs a fifth composite signal CS5 (62) comprising the second intermod signal αF(L1, L2) (72), the third intermod signal α(G/N1)(L1,L2) (74), and a second approximation component $\alpha^2$Adder(L1, L2).

An error amplifier (32) amplifies and inverts the fifth composite signal CS5 (62), and outputs a sixth composite signal CS6 (64) comprising in the second approximation an increased and inverted second intermod signal (−)βαF(L1, L2), an increased and inverted third intermod signal (−)βα(G/N1)(L1,L2), and an increased and inverted second approximation component (−)β$\alpha^2$Adder(L1, L2). An increase factor β can be chosen in such a way as to optimize the performance of the pre-post distortion amplifier 30.

A second delay means (104) is connected to the driver amplifier G/N1 (36) for delaying the third composite signal CS3 (58) in order to equalize the electrical paths of the third composite signal CS3 (58) and the sixth composite signal CS6 (64).

The outer loop further comprises a second adder (106) which sums the delayed third composite signal CS3 and the sixth composite signal CS6, and outputs a seventh composite signal CS7 (66) comprising in the first approximation the two input signals (L1, L2), and an inverted third intermod signal (−)α(G/N1)(L1, L2).

The outer loop also includes a second non-linear high level power amplifier G (38). The high level amplifier G, while amplifying the seventh composite signal CS7, introduces in the first approximation a fourth non-linear intermod signal αG(L, L2) (76) of the two input signals (L1, L2), and outputs an eighth composite signal CS8 (68) comprising the two input signals (L1, L2), the inverted third intermod signal (−)α(G/N1)(L1,L2), and the fourth intermod signal αG(L1, L2). The inverted third intermod signal (−)α(G/N1)(L1,L2) and the fourth intermod signal αG(L1, L2) cancel each other out in the first approximation.

The eighth composite signal CS8 is fed back to the comparator (34) to compensate for gain variation of the second high level power amplifier G (38) and to properly scale the output power of the second low level driver amplifier G/N1 (36) and the second high level power amplifier G (38).

Thus, the first low level driver amplifier F/N2 (42) is post distorted; and the second high level power amplifier G (38) is predistorted, yielding an output signal with high spectral purity because all first approximation intermod signals (distortions) generated by at least two input signals L1 and L2, while propagating within the pre-post distortion circuit, are eliminated by the pre-post distortion circuit itself.

In the preferred embodiment, the outer loop (52) further includes a circuit (110) connected to the error amplifier (32) that stabilizes the gain and phase of the error amplifier means over frequency and temperature, and improves the linearity of the error amplifier.

In one embodiment, the circuit (110) includes a feedforward loop (94,96,100,102, and 98) connected to the error amplifier for stabilizing the gain and phase of the error amplifier over frequency and temperature.

In another embodiment, the circuit (110) includes a feedback loop connected to the error amplifier for stabilizing the gain and phase of the error amplifier over frequency and temperature.

In the best mode of the present invention, the power outputs of the driver and power amplifiers (F/N2 and F, G/N1 and G) are scaled down. The process of scaling down the power outputs of the driver and power amplifiers is disclosed below.

Figure 3:
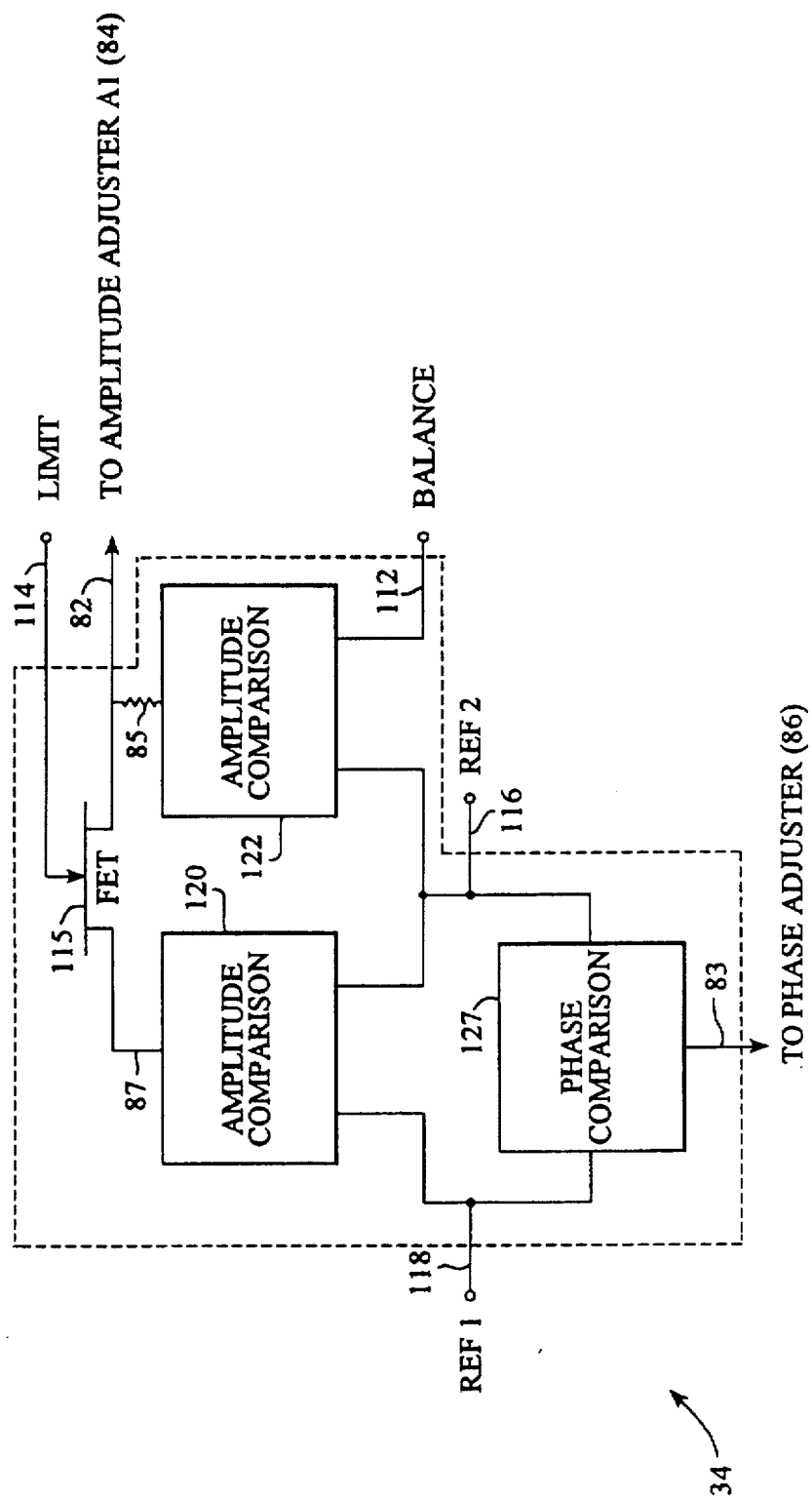
FIG. 3 shows an alternative architecture of a pre-post distortion amplifier.

At first we describe the normal operation of the error amplifier (32), wherein the error amplifier is not overdriven. If this is the case, the error amplifier does not have too much power going through it. Thus, the error amplifier generates only the second and third approximation intermods and does not generate the first approximation intermods. The PAC comparator (34) (see FIG. 3) compares the phases of the Reference 1 signal (118) and the Reference 2 signal (116) in the block (124) and generates the Phase-Error signal (83) that controls the Phase Adjuster (86).

PAC also compares the amplitudes of the Balance signal (112) and the Reference 2 signal (116) in the block (122), and generates the Amplitude-Error1 signal (85). The amplitudes of the CS3 (the Reference 1) and CS4 (the Reference 2) signals are compared in the block (120), and the error signal Amplitude-Error3 (87) is generated, but it is not used.

If the Amplitude-Error3 signal were used to control the amplitude adjuster A1 (84), we would completely cancel out the incoming signals (L1, L2). If the Amplitude-Error1 signal (85) is used to control the Amplitude Adjuster A1 (84), the cancellation of the (L1, L2) signals depends on the gain of the G power amplifier (38). Our goal is to have G and G/N1 with proportional power levels. If CS8 (the Balance signal 112) is less than CS3 (the Reference 2 signal 116), then G has too little gain. The Amplitude-Error1 signal (85) will attenuate the amplitude adjuster A1 (82). This will allow the (L1, L2) signals to travel through the error amplifier (32) and to add power in phase to the CS8 signal, effectively increasing the gain of the amplifier G.

If the G amplifier has too high gain G, the CS8 signal has too much power, that is, CS8 is far greater than the CS3 signal. If this is the case, the error amplifier (32) will effectively decrease the gain G by subtracting the power from the CS8 signal.

Now we describe the abnormal operation of the error amplifier (32), wherein the error amplifier is overdriven. It means that the error amplifier can generate many distortion signals in the first and second approximation. The cause of the abnormal operation of the error amplifier is the situation, wherein the gain of the G amplifier is far off the expected value.

EXAMPLE 2

G has 12 dB gain, instead of expected 10 dB gain. The error amplifier can compensate up to 2 dB in its abnormal operation.

The Limit signal (114) (see FIG. 3) measures the output power signal CS6 of the error amplifier. If the Limit signal reaches some pre-set value, it will turn on a Field Effect Transistor (115). The Field Effect Transistor will start to shift the measurements towards the Reference 1 v. Reference 2. It will continue to do so until the output power CS6 of the error amplifier is within the Limit signal. Thus, the Amplitude-Error1 signal 82 is a sum of two error signals 87 and 85.

No matter whether the Limit is reached or not, the phase comparison is always done in the comparator 34 by comparing the reference 1 signal (118) and the reference 2 signal (116), and by generating the Phase-Error signal (83) that adjusts the phase adjuster (86).

The AGC (46) is used to scale down the F/N2 and F amplifiers. As a result, the disclosed embodiment of the pre-post distortion amplifier has certain advantages over the prior art conventional pre-distortion amplifier depicted in FIG. 1.

Indeed, the power ratio of each power device to its associated driver device is much less than that obtainable with conventional pre-distortion. The worst case power ratio occurs between the power device G (38) and its driver counterpart G/N1 (36). This ratio is now about a factor of 4 compared to a factor of 40 with the conventional pre-distortion system (see discussion above). The ratio of output powers for the power amplifier F (40) and for its counterpart driver amplifier F/N2 (42) is close to unity in the pre-post distortion architecture. The power ratio of 4 can be easily realized by using four output power devices with one identical driver. Thus, the problem associated with replicating the performance of the driver device versus the power output device has been drastically minimized.

However, the architecture of the pre-post distortion system depicted in FIG. 2 has its limitations. Indeed, the phase-adjuster 86 is difficult (too costly) to design at the present time to handle a lot of power. Thus, it is prudent to separate the phase adjustment and the amplitude adjustment channels in order to make the phase adjustment at the lowest possible signal level. The alternative architecture depicted in FIG. 4 separates the phase adjustment and the amplitude adjustment channels.

Figure 4:
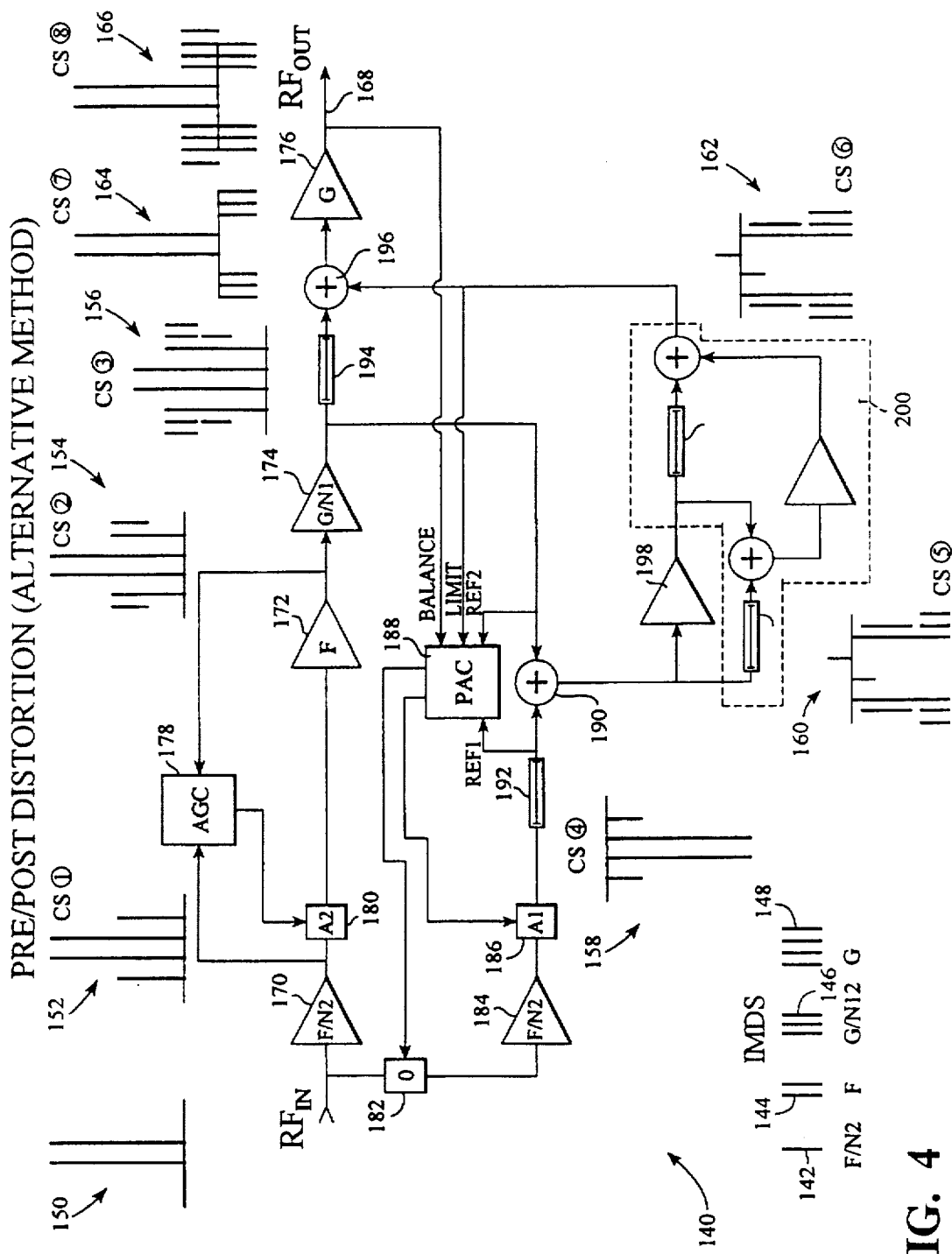
FIG. 4 depicts a phase-amplitude comparator.

The circuit shown in FIG. 4 is similar to the circuit of FIG. 2. Therefore, we focus only on differences. The main difference is the separation of the phase adjustment (182) and the amplitude adjustment (186) channels. This allows one to make a phase adjustment at the lowest possible level of the incoming signal before any amplification took place.

Finally, we describe the method for eliminating non-linear distortions generated by propagation of at least two radio-frequency (RF) signals L1 and L2 through the pre-post distortion apparatus. The method comprises the following steps. The first step is a step of amplifying at least two input RF signals (L1, L2) by a first non-linear low level driver amplifier means F/N2. This amplifier introduces in the first approximation a first intermod signal $\alpha(F/N2)(L1, L2)$ of two input signals (L1, L2), and generates a first composite signal CS1 comprising two input signals (L1, L2) and the first intermod signal $\alpha(F/N2)(L1,L2)$.

The next step is a step of amplifying the first composite signal CS1 by a first non-linear high level power amplifier F. The power amplifier F introduces in the first approximation a second non-linear intermod signal $\alpha F(L1, L2)$, and generates a second composite signal CS2 comprising two input signals (L1, L2), the first intermod signal $\alpha(F/N2)(L1, L2)$, and the second intermod signal $\alpha F(L1, L2)$. The second non-linear low level amplifier G/N1 introduces in the first approximation a third intermod signal $\alpha(G/N1)$ (L1, L2), and generates a third composite signal CS3 comprising two input signals (L1, L2), the first intermod signal $\alpha(F/N2)(L1, L2)$, the second intermod signal $\alpha F(L1, L2)$, and the third intermod signal $\alpha(G/N1)(L1, L2)$.

The phase-amplitude comparator (PAC) amplitude-compares the eighth composite signal CS8 and the third composite signal CS3, and generates a first amplitude error signal Amplitude-Error1. A first amplitude adjuster utilizes the error signal Amplitude-Error1 for amplitude-adjusting the first composite signal CS1 and for closing the inner loop. This procedure also ensures that the power and the driver amplifiers are properly scaled down in their power output.

An automatic gain control circuit (AGC) automatically controls the power levels of the first low level driver amplifier F/N2 and the first high level power amplifier F, ensuring that the power output of the high level power amplifier F is proportional to the power output of the first low level driver amplifier F/N2, and generates a second Amplitude-Error2 signal.

The following step is a step of adjusting the power level of the composite signal CS1 by a second amplitude adjuster A2 that employs the second Amplitude-Error2 signal. The fourth composite signal CS4 and the third composite signal CS3 are summed up to the second approximation by a first adder means which generates a fifth composite signal CS5 comprising the second intermod signal $\alpha F(L1, L2)$, the third intermod signal $\alpha(G/N1)(L1,L2)$, and a second approximation component $\alpha^2 Adder(L1, L2)$.

An error amplifier amplifies and inverts the fifth composite signal CS5, and outputs a sixth composite signal CS6 comprising an increased and inverted second intermod signal $(-)\beta\alpha F(L1, L2)$, an increased and inverted third intermod signal $(-)\beta\alpha(G/N1)(L1,L2)$, and an increased and inverted second approximation component $(-)\beta\alpha^2 Adder(L1, L2)$, wherein $\beta$ is an increase factor that optimizes the compensation.

The second adder sums the delayed third composite signal CS3 with the sixth composite signal CS6, and outputs a seventh composite signal CS7 comprising in the first approximation two input signals (L1, L2) and an inverted third intermod signal $(-)\alpha(G/N1)(L1, L2)$.

Finally, the seventh composite signal CS7 is amplified by a second nonlinear high level power amplifier means G that introduces in the first approximation a fourth non-linear intermod signal $\alpha G(L1, L2)$ of two input signals (L1, L2), and generates an eighth composite signal CS8 comprising in the first approximation two input signals (L1, L2), the fourth non-linear intermod signal $\alpha G(L1, L2)$, and the inverted third intermod signal $(-)\alpha(G/N1)(L1, L2)$. The fourth non-linear intermod signal $\alpha G(L, L2)$ and the inverted third intermod signal cancel each other out. The eighth composite signal CS8 is fed back to the PAC in order to compensate for gain variation of the second high level power amplifier G, and to properly scale the output power of the second low level driver amplifier G/N1 and the second high level power amplifier G. Thus, the first low level driver amplifier F/N2 is post distorted, and the second high level power amplifier G is predistorted, yielding an output signal with high spectral purity.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A pre-post distortion apparatus for eliminating non-linear distortions generated by propagation of at least two radio-frequency (RF) signals L1 and L2 through said pre-post distortion apparatus; said pre-post distortion apparatus comprising:

an inner loop means comprising:

a first non-linear low level driver amplifier means F/N2, wherein said first non-linear low level amplifier means F/N2, while amplifying said at least two input RF signals (L1, L2), introduces in first approximation a first intermod signal $\alpha(F/N2)(L1, L2)$ of said two input signals (L1, L2), $\alpha$ being a parameter of expansion in series, and wherein said first non-linear low level driver amplifier means F/N2 outputs a first composite signal CS1 comprising said two input signals (L1, L2) and said first intermod signal $\alpha(F/N2)(L1,L2)$;

a first non-linear high level power amplifier means F connected to said first non-linear low level amplifier means F/N2, wherein said first non-linear high level amplifier means F, while amplifying said first composite signal CS1 generated by said first non-linear low level amplifier F/N2, introduces in the first approximation a second non-linear intermod signal $\alpha F(L1, L2)$ of said two input signals (L1, L2), and wherein said first non-linear high level power amplifier means F outputs a second composite signal CS2 comprising said two input signals (L1, L2), said first intermod signal $\alpha(F/N2)(L1,L2)$, and said second intermod signal $\alpha F(LL, L2)$;

a second non-linear low level driver amplifier means G/N1 connected to said first high level amplifier means F, wherein said second nonlinear low level amplifier means G/N1, while amplifying said second composite signal CS2 comprising said two input signals (L1, L2), said first intermod signal $\alpha(F/N2)(L1,L2)$, and said second intermod signal $\alpha F(L1, L2)$, introduces in first approximation a third intermod signal $\alpha(G/N1)$ (L1, L2), and wherein said second non-linear low level driver amplifier means G/N1 outputs a third composite signal CS3 comprising said two input signals (L1, L2), said first intermod signal $\alpha(F/N2)(L1,L2)$, said second intermod signal $\alpha F(L1, L2)$, and said third intermod signal $\alpha(G/N1)(L1, L2)$;

a first delay means connected to said F/N2 amplifier means for delaying said first composite signal CS1 and for inverting the phase of said first composite signal CS1, wherein said first delay means generates a fourth composite signal CS4;

a phase-amplitude comparator (PAC) means connected to said second high level amplifier means G and connected to said first low level amplifier means F/N2 for amplitude-comparing an eighth composite signal CS8 and said fourth composite signal CS4, and wherein said PAC means generates a first amplitude error signal Amplitude-Error1;

a first amplitude adjuster means A1 connected to said first low level non-linear amplifier means F/N2 and connected to said PAC means, wherein said first amplitude adjuster means A1 utilizes said first amplitude error signal Amplitude-Error1 generated by said PAC means for amplitude-adjusting of said first composite signal CS1 and for closing said inner loop;

an automatic gain control circuit (AGC) means connected to said first low level amplifier means F/N2 and connected to said first high level amplifier means F for automatically controlling the power levels of said first low level amplifier F/N2 and said first high level amplifier F, for ensuring that the power output of said high level amplifier means F is proportional to the power output of said first low level amplifier means F/N2, and for generating a second Amplitude-Error2 signal; and a second amplitude adjuster means A2 connected to said AGC means and connected to said first low level amplifier means F/N2, wherein said second amplitude adjuster means A2 utilizes said second Amplitude-Error2 signal for adjusting the power level of said composite signal CS1 generated by said low level amplifier F/N2; and an outer loop means connected to said inner loop means, said outer loop means comprising:

a first adder means connected to said first delay means and connected to said second low level amplifier means G/N1 for summing said fourth composite signal CS4 and said third composite signal CS3 up to the second approximation, wherein said first adder means outputs a fifth composite signal CS5 comprising said second intermod signal $\alpha F(L1, L2)$, said third intermod signal $\alpha(G/N1)(L1,L2)$, and a second approximation component $\alpha^2 Adder(L1, L2)$;

an error amplifier means connected to said first adder means for amplifying and inverting said fifth composite signal CS5, wherein said error amplifier outputs a sixth composite signal CS6 comprising in the second approximation an increased and inverted second intermod signal $(-)\beta\alpha F(L1, L2)$, an increased and inverted third intermod signal $(-)\beta\alpha (G/N1)(L1,L2)$, and an increased and inverted second approximation component $(-)\beta\alpha^2 Adder(L1, L2)$, wherein $\beta$ is an increase factor that optimizes the compensation;

a second delay means connected to said second low level amplifier means G/N1 for delaying said third composite signal CS3 in order to equalize the electrical paths of said third composite signal CS3 and said sixth composite signal CS6 generated by said error amplifier means;

a second adder means connected to said error amplifier means and connected to said second delay means for summing said delayed third composite signal CS3 and said sixth composite signal CS6, wherein said second adder means outputs a seventh composite signal CS7 comprising in the first approximation said two input signals (L1, L2), and an inverted third intermod signal $(-)\alpha(G/N1)(L1, L2)$;

a second non-linear high level power amplifier means G connected to said second adder means, wherein said second non-linear high level amplifier means G, while amplifying said seventh composite signal CS7 generated by said second adder means, introduces in the first approximation a fourth non-linear intermod signal $\alpha G(L1, L2)$ of said two input signals (L1, L2), and wherein said second non-linear high level power amplifier means G outputs said eighth composite signal CS8 comprising said two input signals (L1, L2), said inverted third intermod signal $(-)\alpha(G/N1)(L1,L2)$, and said fourth intermod signal $\alpha G(L1, L2)$, and wherein said inverted third intermod signal $(-)\alpha(G/N1)(L1,L2)$, and said fourth intermod signal $\alpha G(L1, L2)$ cancel each other out in the first approximation; and wherein said eighth composite signal CS8 is fed back to said PAC means to compensate for gain variation of said second high level driver amplifier means G and to properly scale the output power of said second low level driver amplifier G/N1 and said second high level power amplifier G; and wherein said first low level driver amplifier F/N2 is post distorted; and wherein said second high level power amplifier G is predistorted, yielding an output signal with high spectral purity.

2. The apparatus of claim 1;

wherein said inner loop further includes a phase adjuster means Θ connected to said first amplitude adjuster means A1 and connected to said PAC means;

wherein said phase-amplitude comparator (PAC) means generates a phase error signal Phase-Error; and wherein said phase adjuster means Θ utilizes said phase error signal Phase-Error for phase- adjusting said first composite signal CS1 and for closing said inner loop.

3. The apparatus of claim 1, wherein said outer loop means further includes a circuit connected to said error amplifier means for stabilizing the gain and phase of said error amplifier means over frequency and temperature, and for improving the linearity of said error amplifier means.

4. The apparatus of claim 3, wherein said circuit for stabilizing the gain and phase of said error amplifier over frequency and temperature further includes a feedforward loop connected to said error amplifier for stabilizing the gain and phase of said error amplifier over frequency and temperature.

5. The apparatus of claim 3, wherein said circuit for stabilizing the gain and phase of said error amplifier over frequency and temperature further includes a feed back loop connected to said error amplifier for stabilizing the gain and phase of said error amplifier over frequency and temperature.

6. A pre-post distortion apparatus for eliminating non-linear distortions generated by propagation of at least two radio-frequency (RF) signals L1 and L2 through said pre-post distortion apparatus; said pre-post distortion apparatus comprising:

an inner loop means comprising:

a first non-linear low level driver amplifier means F/N2, wherein said first non-linear low level amplifier means F/N2, while amplifying said at least two input RF signals (L1, L2), introduces in first approximation a first intermod signal α(F/N2)(L1, L2) of said two input signals (L1, L2), α being a parameter of expansion in series, and wherein said first non-linear low level driver amplifier means F/N2 outputs a first composite signal CS1 comprising said two input signals (L1, L2) and said first intermod signal α(F/N2)(L1,L2);

a first non-linear high level power amplifier means F connected to said first non-linear low level amplifier means F/N2, wherein said first non-linear high level amplifier means F, while amplifying said first composite signal CS1 generated by said first non-linear low level amplifier F/N2, introduces in the first approximation a second non-linear intermod signal αF(L1, L2) of said two input signals (L1, L2), and wherein said first non-linear high level power amplifier means F outputs a second composite signal CS2 comprising said two input signals (L1, L2), said first intermod signal α(F/N2)(L1,L2), and said second intermod signal αF(L1, L2);

a second non-linear low level driver amplifier means G/N1 connected to said first high level amplifier means F, wherein said second nonlinear low level amplifier means G/N1, while amplifying said second composite signal CS2 comprising said two input signals (L1, L2), said first intermod signal α(F/N2) (L1,L2), and said second intermod signal αF(L1, L2), introduces in first approximation a third intermod signal α(G/N1) (L1, L2), and wherein said second non-linear low level driver amplifier means G/N1 outputs a third composite signal CS3 comprising said two input signals (L1, L2), said first intermod signal α(F/N2)(L1,L2), said second intermod signal αF(L1, L2), and said third intermod signal α(G/N1)(L1, L2);

a third non-linear low level driver amplifier means F*/N2, wherein said first non-linear low level amplifier means F*/N2, while amplifying said two input RF signals (L1, L2), introduces in first approximation a first intermod signal α(F*/N2)(L1, L2) of said two input signals (L1, L2), and wherein said third non-linear low level driver amplifier means F*/N2 outputs a fourth composite signal CS4 comprising said two input signals (L1, L2) and said fourth intermod signal α(F*/N2)(L1,L2);

a phase-amplitude comparator (PAC) means; wherein said PAC phase-compares two signals in a phase channel, and wherein said PAC amplitude-compares two signals in an amplitude channel; and wherein said phase channel comprises said PAC, connected to said PAC said second low level amplifier means G/N1, and connected to said PAC said first low level amplifier means F/N2 for phase-comparing said first composite signal CS1 and said third composite signal CS3, said PAC means generating a phase error signal Phase-Error; and wherein said amplitude channel comprises said PAC, connected to said PAC said second low level amplifier means G/N1, and connected to said PAC said third low level amplifier means F*/N2 for amplitude-comparing said fourth composite signal CS4 and said third composite signal CS3, said PAC means generating a first amplitude error signal Amplitude-Error1;

a phase adjuster means Θ connected to said PAC means, wherein said phase adjuster means Θ utilizes said phase error signal Phase-Error generated by said PAC means for phase-adjusting said incoming two input signals (L1, L2), and wherein said phase adjusting operation is performed at the initial power level of the incoming signal;

a first delay means connected to said PAC means and connected to said third F*/N2 amplifying means for delaying said fourth composite signal CS4;

a first amplitude adjuster means A1 connected to said fourth low level non-linear amplifier means F*/N2 and connected to said PAC means, wherein said first amplitude adjuster means A1 utilizes said first amplitude error signal Amplitude-Error1 generated by said PAC means for amplitude-adjusting of said fourth composite signal CS4 and for closing said inner loop;

an automatic gain control circuit (AGC) means connected to said first low level amplifier means F/N2 and connected to said first high level amplifier means F for automatically controlling the power levels of said first low level amplifier F/N2 and said first high level amplifier F, for ensuring that the power output of said high level amplifier means F is proportional to the power output of said first low level amplifier means F/N2, and for generating a second Amplitude-Error2 signal; and a second amplitude adjuster means A2 connected to said AGC means and connected to said first low level amplifier means F/N2, wherein said second amplitude adjuster means A2 utilizes said second Amplitude-Error2 signal for adjusting the power level of said composite signal CS1 generated by said low level amplifier F/N2; and an outer loop means connected to said inner loop means, said outer loop means comprising:

a first adder means connected to said first delay means and connected to said second low level amplifier means G/N1 for summing said delayed fourth composite signal CS4 and said third composite signal CS3 up to the second approximation, wherein said first adder means outputs a fifth composite signal CS5 comprising said second intermod signal $\alpha F(L1, L2)$, said third intermod signal $\alpha(G/N1)(L1,L2)$, and a second approximation component $\alpha^2 Adder(L1, L2)$;

an error amplifier means connected to said first adder means for amplifying and inverting said fifth composite signal CS5, wherein said error amplifier outputs a sixth composite signal CS6 in the second approximation comprising an increased and inverted second intermod signal $(-)\beta\alpha(L1, L2)$, an increased and inverted third intermod signal $(-)\beta\alpha(G/N1)(L1, L2)$, and an increased and inverted second approximation component $(-)\beta\alpha^2 Adder(L1, L2)$, wherein $\beta$ is an increase factor that optimizes the compensation;

a second delay means connected to said second low level amplifier means G/N1 for delaying said third composite signal CS3 in order to equalize the electrical paths of said third composite signal CS3 and said sixth composite signal CS6 generated by said error amplifier means;

a second adder means connected to said error amplifier means and connected to said second delay means for summing said delayed third composite signal CS3 and said sixth composite signal CS6, wherein said second adder means outputs a seventh composite signal CS7 comprising in the first approximation said two input signals (L1, L2), and an inverted third intermod signal $(-)\alpha(G/N1)(L1, L2)$;

a second non-linear high level power amplifier means G connected to said second adder means, wherein said second non-linear high level amplifier means G, while amplifying said seventh composite signal CS7 generated by said second adder means, introduces in the first approximation a fifth non-linear intermod signal $\alpha G(L1, L2)$ of said two input signals (L1, L2), and wherein said second non-linear high level power amplifier means G outputs an eighth composite signal CS8 comprising in the first approximation said two input signals (L1, L2), said inverted third intermod signal $(-)\alpha(G/N1)(L1,L2)$, and said fifth intermod signal $\alpha G(L1, L2)$, and wherein said inverted third intermod signal $(-)\alpha(G/N1)(L1,L2)$ and said fifth intermod signal $\alpha G(L1, L2)$ cancel each other out in the first approximation; and wherein said eighth composite signal CS8 is fed back to said PAC means to compensate for gain variation of said second high level power amplifier means G and to properly scale the output power of said second low level driver amplifier G/N1 and said second high level power amplifier G; and wherein said first low level driver amplifier F/N2 is post distorted; and wherein said second high level power amplifier G is predistorted, yielding an output signal with high spectral purity.

7. The apparatus of claim 6, wherein said outer loop further includes a circuit connected to said error amplifier for stabilizing the gain and phase of said error amplifier over frequency and temperature, and for improving linearity of said error amplifier.

8. The apparatus of claim 7, wherein said circuit for stabilizing the gain and phase of said error amplifier over frequency and temperature further includes a feedforward loop connected to said error amplifier for stabilizing the gain and phase of said error amplifier over frequency and temperature.

9. The apparatus of claim 7, wherein said circuit for stabilizing the gain and phase of said error amplifier over frequency and temperature further includes a feedback loop connected to said error amplifier for stabilizing the gain and phase of said error amplifier over frequency and temperature.

10. A pre-post distortion method for eliminating non-linear distortions generated by propagation of at least two radio-frequency (RF) signals L1 and L2 through said pre-post distortion apparatus; said pre-post distortion method comprising the steps of:

(1) amplifying said at least two input RF signals (L1, L2) by a first non-linear low level driver amplifier means F/N2; (2) introducing in first approximation by said first non-linear low level driver amplifier means F/N2 a first intermod signal $\alpha(F/N2)(L1, L2)$ of said two input signals (L1, L2), $\alpha$ being a parameter of expansion in series;

(3) generating by said first non-linear low level driver amplifier means F/N2 a first composite signal CS1 comprising said two input signals (L1, L2) and said first intermod signal $\alpha(F/N2)(L1,L2)$;

(4) amplifying said first composite signal CS1 by a first non-linear high level power amplifier means F;

(5) introducing in the first approximation a second non-linear intermod signal $\alpha F(L1, L2)$ of said two input signals (L1, L2) by said first non-linear high level amplifier means F;

(6) generating by said first non-linear high level power amplifier means F a second composite signal CS2 comprising said two input signals (L1, L2), said first intermod signal $\alpha(F/N2)(L1,L2)$, and said second intermod signal $\alpha F(L1, L2)$;

(7) amplifying said second composite signal CS2 by a second non-linear low level driver amplifier means G/N1;

(8) introducing in first approximation a third intermod signal $\alpha(G/N1)(L1, L2)$ by said second non-linear low level amplifier means G/N1;

(9) generating by said second non-linear low level driver amplifier means G/N1 a third composite signal CS3 comprising said two input signals (L1, L2), said first intermod signal $\alpha(F/N2)(L1,L2)$, said second intermod signal $\alpha F(L1, L2)$, and said third intermod signal $\alpha(G/N1)(L1, L2)$;

(10) amplitude-comparing said first composite signal CS1 and said third composite signal CS3 by a phase-amplitude comparator (PAC) means, wherein said PAC means generates a first amplitude error signal Amplitude Error1;

(11) delaying and inverting the phase of said first composite signal CS1 by a first delay means, wherein said first delay means generates a fourth composite signal CS4;

(12) amplitude-adjusting said first composite signal CS1 and closing said inner loop by a first amplitude adjuster means A1, wherein said first amplitude adjuster means A1 utilizes said first amplitude error signal Amplitude-Error1 generated by said PAC means;

(13) automatically controlling the power levels of said first low level amplifier F/N2 and said first high level amplifier F, ensuring that the power output of said high level amplifier means F is proportional to the power output of said first low level amplifier means F/N2, and generating a second Amplitude-Error2 signal by an automatic gain control circuit (AGC) means;

(14) adjusting the power level of said composite signal CS1 by a second amplitude adjuster means A2, wherein said second amplitude adjuster means A2 utilizes said second Amplitude-Error2 signal;

(15) summing said fourth composite signal CS4 and said third composite signal CS3 up to the second approximation by a first adder means;

(16) generating by said first adder means a fifth composite signal CS5 comprising said second intermod signal $\alpha F(L1, L2)$, said third intermod signal $\alpha(G/N1)(L1, L2)$, and a second approximation component $\alpha^2$Adder (L1, L2);

(17) amplifying and inverting said fifth composite signal CS5 by an error amplifier means, wherein said error amplifier means outputs a sixth composite signal CS6 comprising an increased and inverted second intermod signal $(-)\beta\alpha F(L1, L2)$, an increased and inverted third intermod signal $(-)\beta\alpha(G/N1)(L1,L2)$, and an increased and inverted second approximation component $(-)\beta\alpha^2$Adder(L1, L2), wherein $\beta$ is an increase factor that optimizes the compensation;

(18) delaying said third composite signal CS3 by a second delay means in order to equalize the electrical paths of said third composite signal CS3 and said sixth composite signal CS6;

(19) summing said delayed third composite signal CS3 and said sixth composite signal CS6 by a second adder means, wherein said second adder means outputs a seventh composite signal CS7 comprising in the first approximation said two input signals (L1, L2), and an inverted third intermod signal $(-)\alpha(G/N1)(L1, L2)$;

(20) amplifying said seventh composite signal CS7 by a second non-linear high level power amplifier means G;

(21) introducing in the first approximation a fourth non-linear intermod signal $\alpha G(L1, L2)$ of said two input signals (L1, L2) by said second high level power amplifier means G;

(22) generating an eighth composite signal CS8 comprising in the first approximation said two input signals (L1, L2), said fourth non-linear intermod signal $\alpha G(L1, L2)$, and said inverted third intermod signal $(-)\alpha(G/N1)(L1, L2)$, wherein said fourth non-linear intermod signal $\alpha G(L1, L2)$ and said inverted third intermod signal cancel each other out; and

(23) feeding back said eighth composite signal CS8 to said PAC means in order to compensate for gain variation of said second high level driver amplifier means G and to properly scale the output power of said second low level driver amplifier G/N1 and said second high level power amplifier G, wherein said first low level driver amplifier F/N2 is post distorted, and wherein said second high level power amplifier G is predistorted, yielding an output signal with high spectral purity.

\* \* \* \* \*